(12) United States Patent
Chen

(10) Patent No.: US 8,382,333 B2
(45) Date of Patent: Feb. 26, 2013

(54) LIGHT EMITTING DEVICE

(76) Inventor: Kuei-Fang Chen, Hsinchu (TW)

( * ) Notice: Subject to any disclaimer, the term of this patent is extended or adjusted under 35 U.S.C. 154(b) by 0 days.

(21) Appl. No.: 13/152,556

(22) Filed: Jun. 3, 2011

(65) Prior Publication Data
US 2012/0307505 A1    Dec. 6, 2012

(51) Int. Cl.
*F21V 29/00* (2006.01)
(52) U.S. Cl. ............. 362/294; 362/218; 362/249.02
(58) Field of Classification Search ......... 362/249.02, 362/218, 294, 373
See application file for complete search history.

(56) References Cited

U.S. PATENT DOCUMENTS

| | | | | |
|---|---|---|---|---|
| 8,136,977 B2 * | 3/2012 | Chiang et al. | ............ | 362/631 |
| 2004/0120156 A1 * | 6/2004 | Ryan | ............ | 362/373 |
| 2005/0180142 A1 * | 8/2005 | Tsai | ............ | 362/294 |
| 2006/0262533 A1 * | 11/2006 | Lin et al. | ............ | 362/249.02 |
| 2008/0061314 A1 * | 3/2008 | Liaw et al. | ............ | 257/99 |
| 2009/0097233 A1 * | 4/2009 | Ooya et al. | ............ | 362/249.02 |

FOREIGN PATENT DOCUMENTS

| | | |
|---|---|---|
| TW | M311119 | 5/2007 |
| TW | M311844 | 5/2007 |

* cited by examiner

*Primary Examiner* — Y My Quach Lee
(74) *Attorney, Agent, or Firm* — Grossman Tucker Perreault & Pfleger PLLC

(57) ABSTRACT

A light emitting device includes: a heat dissipating plate having first and second regions, the first region having a mesa with a first top surface, the second region having a second top surface, the first top surface being higher than the second top surface; a circuit board disposed above the heat dissipating plate, and including a first area that has a through hole to permit the mesa to extend therethrough and that directly contacts the second top surface of the second region of the heat dissipating plate, and a second area that does not contact the heat dissipating plate; and a light emitting element disposed on the mesa of the heat dissipating plate and electrically connected to the conductive layer.

8 Claims, 7 Drawing Sheets

LIGHT EMITTING DEVICE

BACKGROUND OF THE INVENTION

1. Field of the Invention

The invention relates to a light emitting device.

2. Description of the Related Art

TW Patent nos. M311844 and M311119 respectively disclose a light emitting device including a circuit board, a plurality of light emitting elements, a heat dissipating plate disposed beneath the circuit board, and a heat conductive layer disposed between the light emitting elements and the heat dissipating plate. In these patents, the circuit board contacts completely the heat dissipating plate. When an electrical wire is to be soldered to the circuit board, a molten solder material is likely to be solidified early attributed to the high heat conductivity of the heat dissipating plate. Thus, the electrical wire may not be soldered at a desired position, and the soldering effect between the electrical wire and the circuit board would be adversely influenced.

SUMMARY OF THE INVENTION

The object of the present invention is to provide a light emitting device that can overcome the drawback mentioned above.

The light emitting device according to the present invention comprises a heat dissipating plate, a circuit board and a light emitting element.

The heat dissipating plate has first and second regions. The first region has a mesa with a first top surface. The second region has a second top surface. The first top surface is higher than the second top surface.

The circuit board is disposed above the heat dissipating plate, and includes a first area that has a through hole to permit the mesa to extend therethrough and that directly contacts the second top surface of the second region of the heat dissipating plate, and a second area that does not contact the heat dissipating plate.

The light emitting element is disposed on the mesa of the heat dissipating plate and is electrically connected to the circuit board.

BRIEF DESCRIPTION OF THE DRAWINGS

The above and other features and advantages of the present invention will become apparent in the following detailed description of the preferred embodiments with reference to the accompanying drawings, of which.

DETAILED DESCRIPTION OF THE PREFERRED EMBODIMENTS

Figure 1:
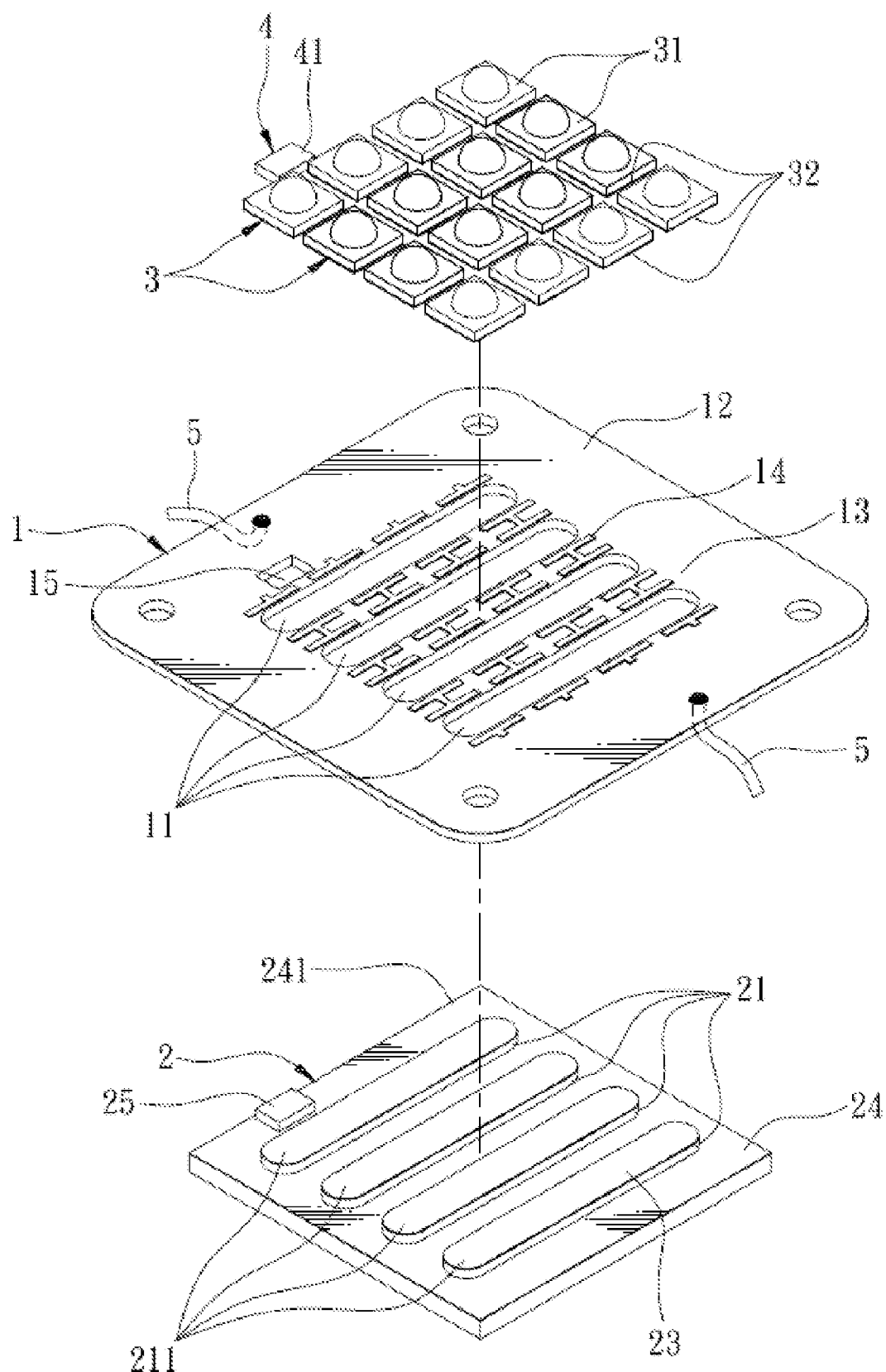
FIG. 1 is an exploded perspective view of the first preferred embodiment of a light emitting device of this invention.
Figure 2:
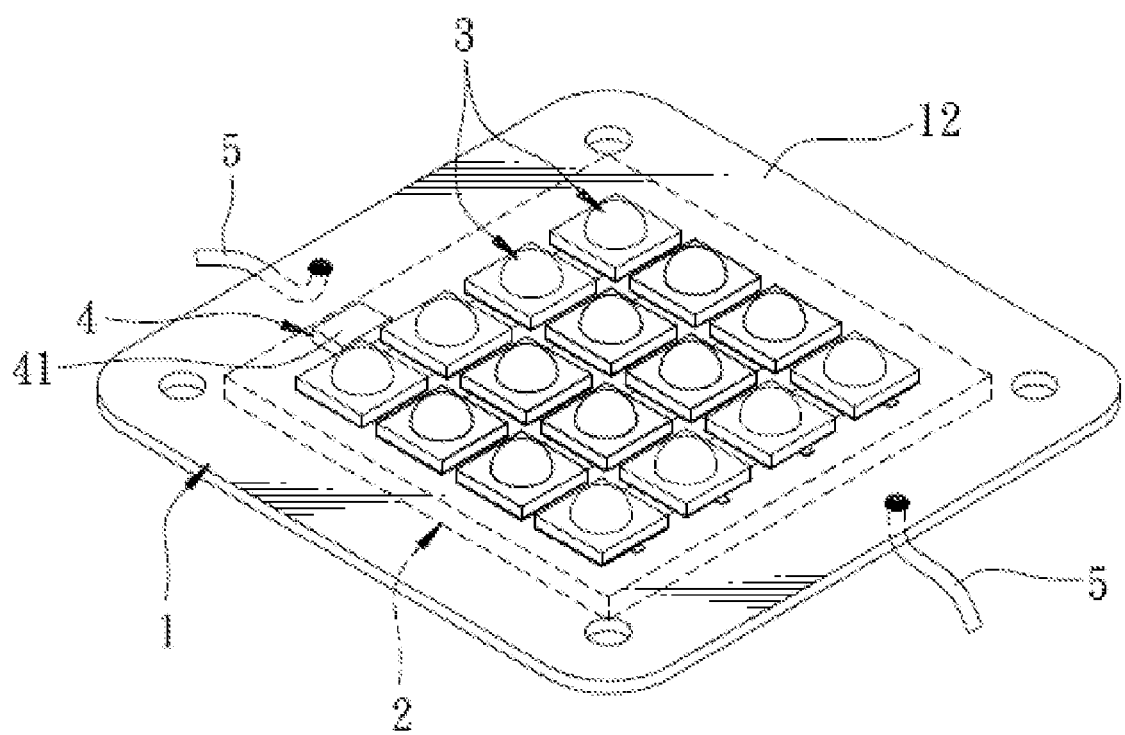
FIG. 2 is a perspective view illustrating the first preferred embodiment shown in FIG. 1 in an assembled state.
Figure 3:
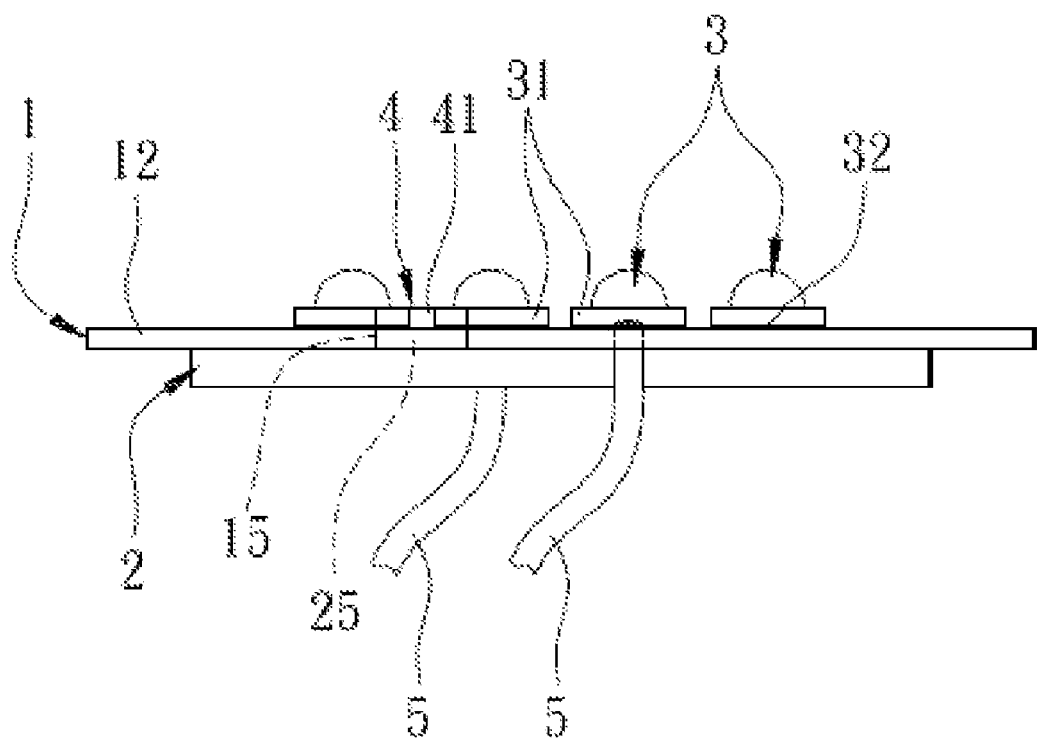
FIG. 3 is a side view illustrating the first preferred embodiment shown in FIG. 1.
Figure 4:
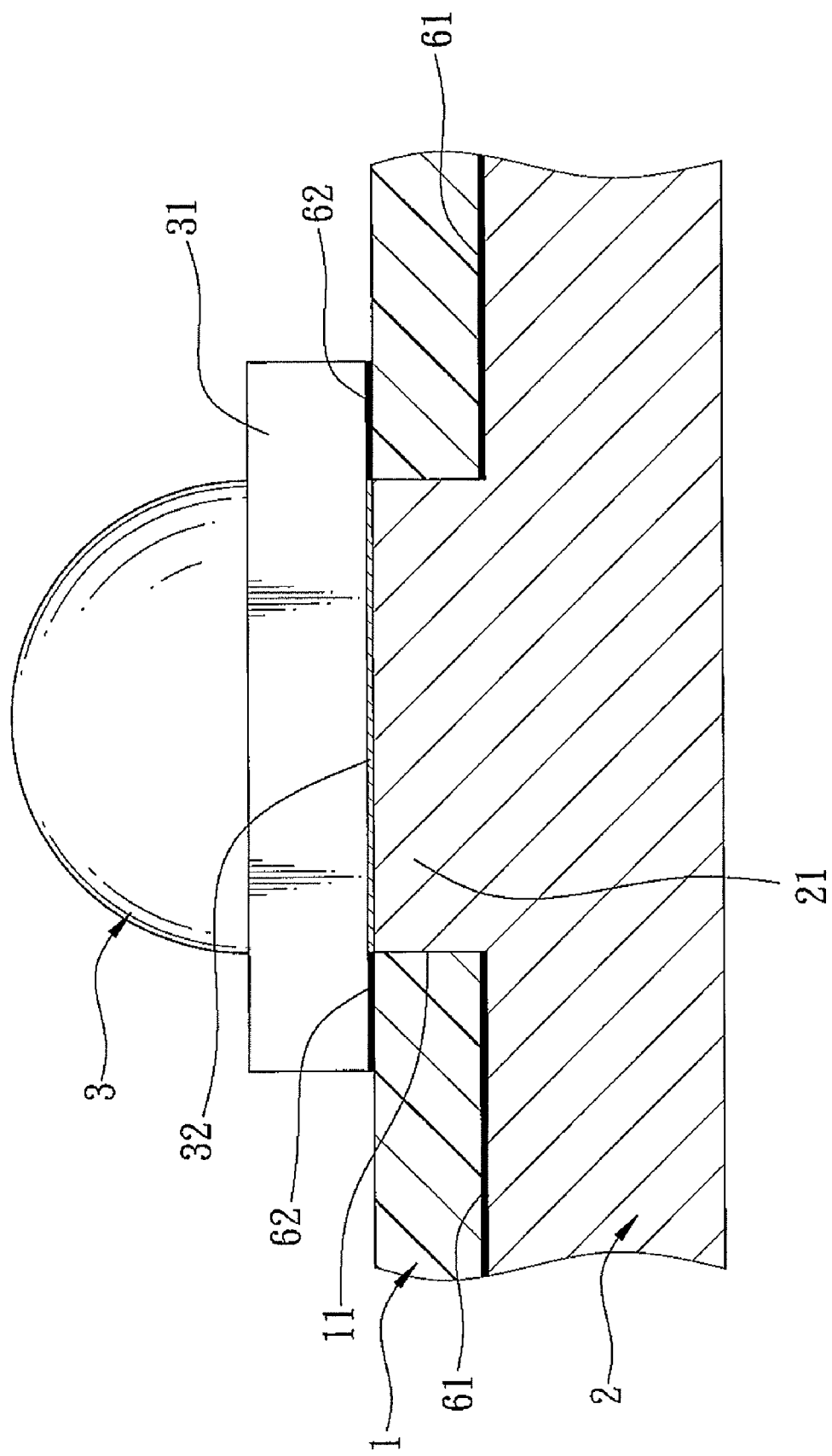
FIG. 4 is a fragmentary sectional view of the first preferred embodiment shown in FIG. 1.

FIGS. 1 to 4 show the first preferred embodiment of a light emitting device according to the present invention, which comprises a heat dissipating plate 2, a circuit board 1, a plurality of light emitting elements 3, a monitor unit 4, and an electrical wire 5 soldered to the circuit board 1.

The heat dissipating plate 2 has non-overlapping first and second regions 23, 24. The first region 23 has a plurality of mesas 21 each of which has a first top surface 211. The second region 24 has a second top surface 241. Each of the first top surfaces 211 is higher than the second top surface 241.

The circuit board 1 is disposed above the heat dissipating plate 2, and includes a first area 13 that has a plurality of through holes 11 to permit the mesas 21 of the heat dissipating plate 2 to extend therethrough, and that directly contacts the second top surface 241 of the second region 24 of the heat dissipating plate 2, and a second area 12 that does not contact the heat dissipating plate 2. In this embodiment, the second area 12 extends from the first area 13 and beyond the heat dissipating plate 2. The circuit board 1 further includes a conductive layer 14 formed on the first area 13 of the circuit board 1.

The light emitting elements 3 are disposed on the mesas 21 of the heat dissipating plate 2 and are electrically connected to the conductive layer 14. Each light emitting element 3 comprises a ceramic base 31 made of aluminum nitride.

The monitor unit 4 includes a thermistor 41 that is electrically connected with the light emitting element 3. The heat dissipating plate 2 is formed with a protrusion 25 on a second top surface 241 of the second region 24, and the circuit board 1 is formed with a hole 15 in the first area 13 to permit the protrusion 25 extending therethrough and contacting with the thermistor 41. The thermistor 41 is used for indirectly detecting the temperature of the light emitting elements 3 by detecting the temperature of the protrusion 25 of the heat dissipating plate 2. The resistance of the thermistor 41 will vary depending on the detected temperature, thereby adjusting electric current of the light emitting device so as to prevent damage to the light emitting elements 3.

In this invention, the electrical wire 5 is soldered to the second area 12 of the circuit board 1. Since the second area 12 does not contact the heat dissipating plate 2, soldering of the electrical wire 5 to the second area 12 of the circuit board 1 will not be influenced by the heat dissipating plate 2, and a solder material will not solidify early. Thus, the electrical wire 5 can be properly positioned on and soldered to the circuit board 1 within a short time, thereby improving the soldering effect between the electrical wire 5 and the circuit board 1.

Preferably, a eutectic alloy layer 32 is formed between a bottom surface of the respective one of the ceramic bases 31 and a top surface 211 of the respective one of the mesas 21, and is made of gold-tin alloy. The eutectic alloy layer 32 is used to improve the efficiency of the heat dissipation of the light emitting device. In this invention, a low melting point solder 62 is used to bond the light emitting element 3 to the circuit board 1 and the heat dissipating plate 2. The low melting point solder 62 has a melting point less than 150° C.

In this invention, the ceramic base 31 is able to endure a voltage up to 20 kV, and has a thermal conductivity of 200 W/mk. The light emitting element 3 is able to endure temperatures of up to 150° C., and has a current flow of 4 amperes.

Figure 5:
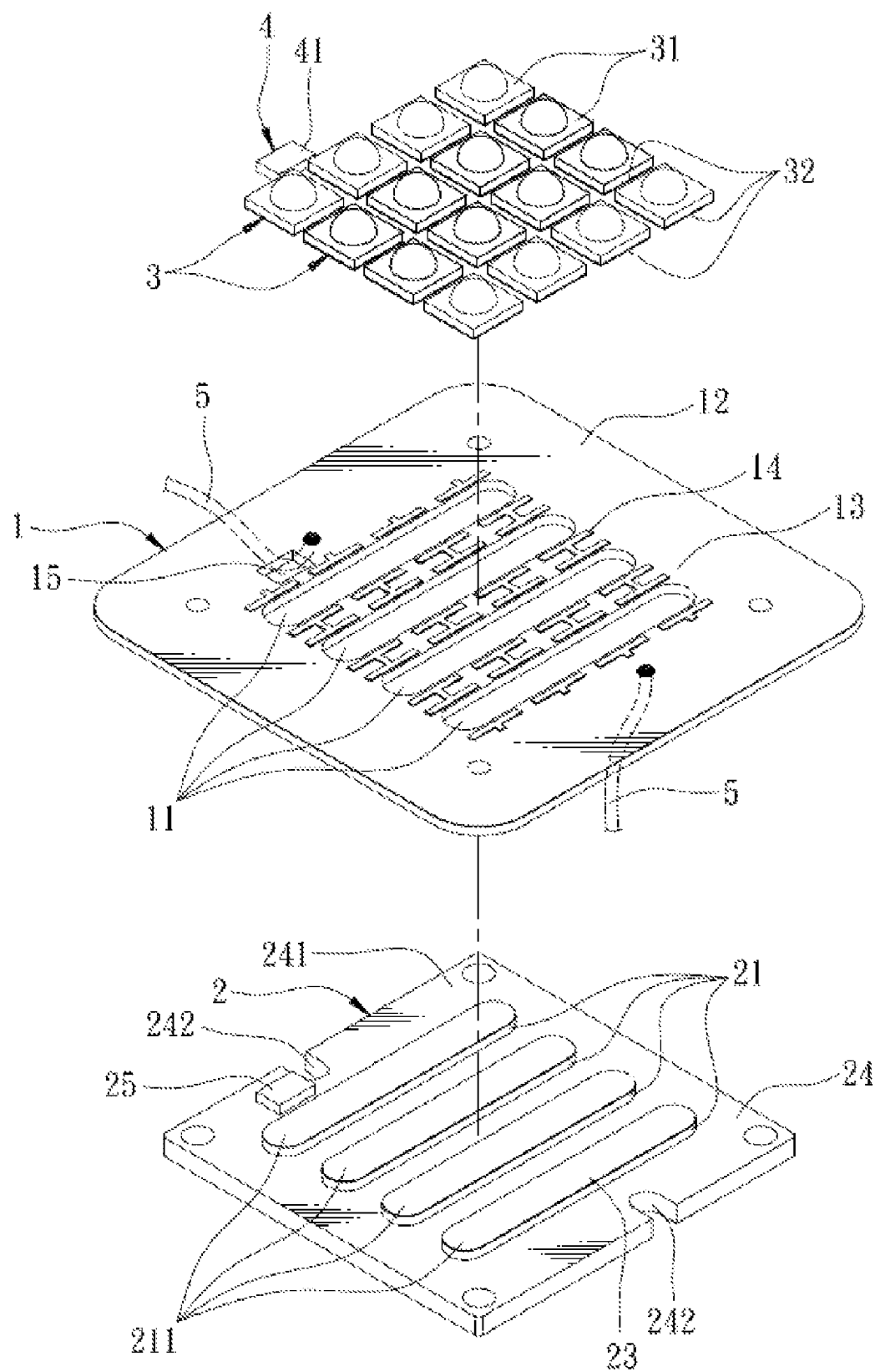
FIG. 5 is an exploded perspective view of the second preferred embodiment of the light emitting device of this invention.
Figure 6:
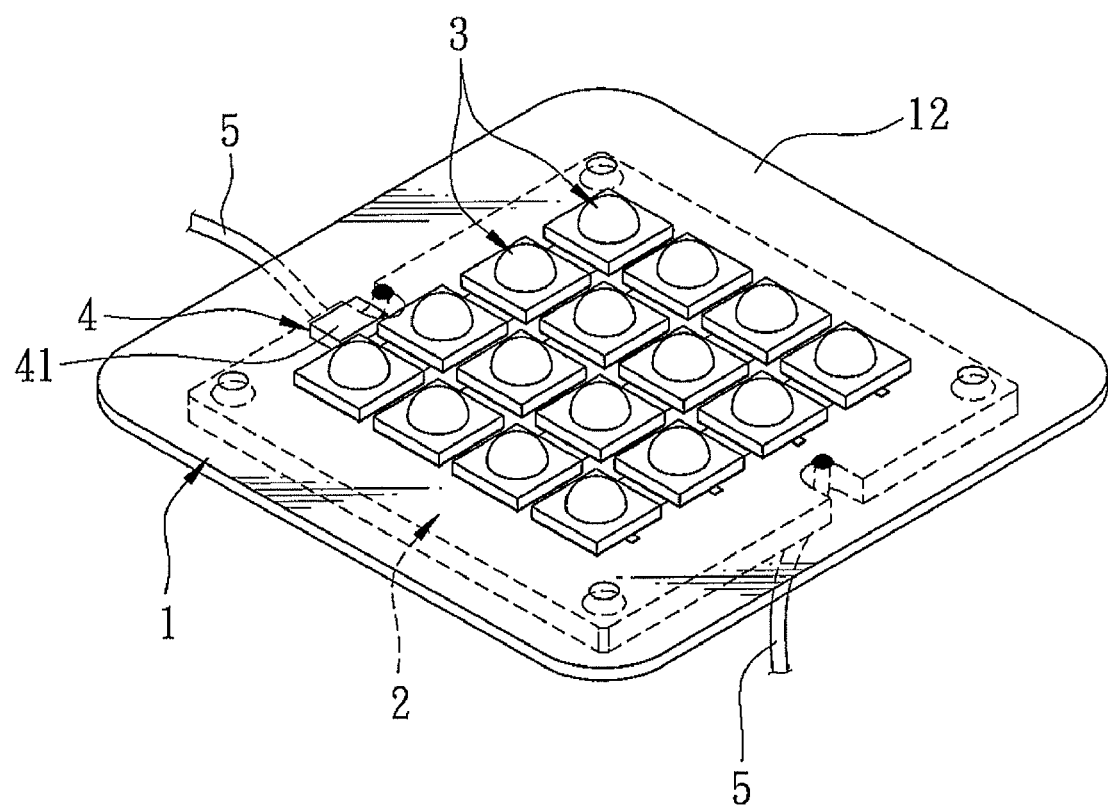
FIG. 6 is a perspective view illustrating the second preferred embodiment shown in FIG. 5 in an assembled state.

FIGS. 5 and 6 show the second preferred embodiment of the light emitting device of this invention. The second preferred embodiment is similar to the first preferred embodiment, except that the heat dissipating plate 2 has a cutout 242 beneath the second area 12 of the circuit board 1 such that the second area 12 does not contact the heat dissipating plate 2.

When fabricating the light emitting device, the circuit board 1 and the heat dissipating plate 2 are first soldered together using a high melting point solder 61, followed by soldering the light emitting elements 3 and the circuit board 1 using the aforesaid low melting point solder 62, such that the high melting point solder 61 is kept from melting when the low melting point solder 62 is molten for soldering. In this invention, the high melting point solder 61 has a melting point of 260° C. Moreover, both of the high melting point solder 61 and the low melting point solder 62 are compressed under an elevated pressure, so that the thickness thereof are even and small. It should be noted that, during soldering the light emitting elements 3 and the circuit board 1, the eutectic alloy layer 32 is also formed by eutectic reaction of first and second gold-tin alloy films respectively formed on the first top surfaces 211 of the mesas 21 and the bottom surface of the ceramic base 31. The applicant found that, during the eutectic reaction and soldering of the light emitting elements 3 and the circuit board 1, most of the low melting point solder 62 applied on the first gold-tin alloy film is compressed and escapes to the space formed between the circuit board 1 and the ceramic base 31 of the light emitting element 3. A very few amount of the low melting point solder 62 is compressed into the eutectic alloy layer 32 to fill pores, and the air in the pores is expelled, thereby improving the quality of the light emitting device.

Further, a difference between the combined height of the mesa 21 and the eutectic alloy layer 32 and the height of the circuit board 1 is less than 0.03 mm, such that the thickness of the low melting point solder 62 is restricted and thereby improving the heat dissipating efficiency of the light emitting device.

Figure 7:
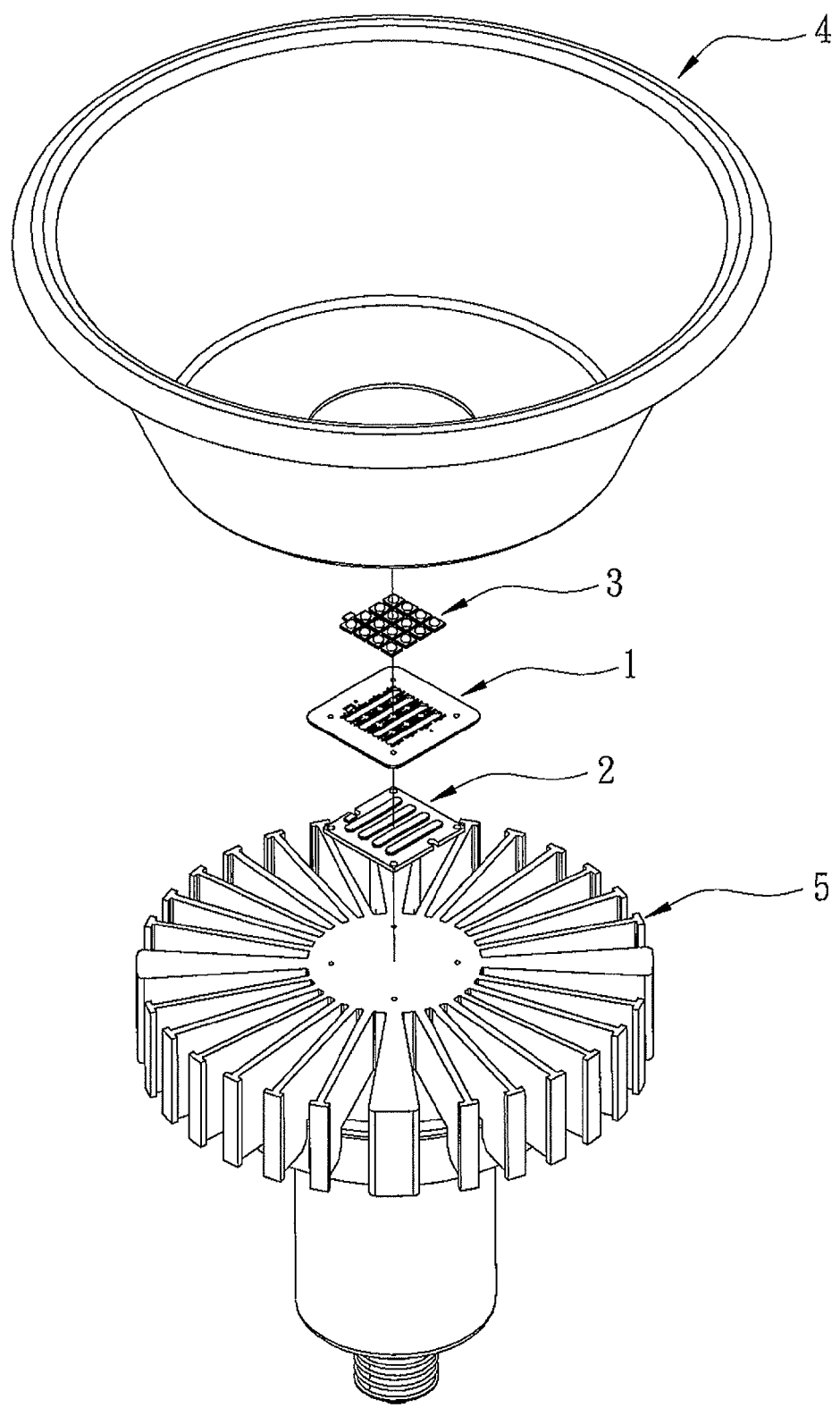
FIG. 7 is an exploded perspective view illustrating a lamp including the second preferred embodiment of the light emitting device shown in FIG. 5.

As shown in FIG. 7, the light emitting device of this invention can be assembled into a lamp with a lamp holder 5 and a lampshade 4.

While the present invention has been described in connection with what are considered the most practical and preferred embodiments, it is understood that this invention is not limited to the disclosed embodiments but is intended to cover various arrangements included within the spirit and scope of the broadest interpretation and equivalent arrangements.

What is claimed is:

1. A light emitting device, comprising:
   a heat dissipating plate having first and second regions, said first region having a mesa with a first top surface, said second region having a second top surface, said first top surface being higher than said second top surface;
   a circuit board disposed above said heat dissipating plate, and including a first area that has a through hole to permit said mesa to extend therethrough and that directly contacts said second top surface of said second region of said heat dissipating plate, and a second area that does not contact said heat dissipating plate;
   a light emitting element disposed on said mesa of said heat dissipating plate and electrically connected to said circuit board: and
   a eutectic alloy layer between said light emitting element and said mesa;
   wherein said light emitting element is soldered to said heat dissipating plate and said circuit board using a low melting point solder which is also compressed into the eutectic alloy layer.

2. The light emitting device of claim 1, wherein said second area extends beyond said heat dissipating plate.

3. The light emitting device of claim 1, wherein said heat dissipating plate has a cutout beneath said second area of said circuit board.

4. The light emitting device of claim 1, further comprising an electrical wire soldered to said second area of said circuit board.

5. The light emitting device of claim 1, wherein said light emitting element has a base made of aluminum nitride.

6. The light emitting device of claim 1, wherein a difference between the combined height of said mesa and said eutectic alloy layer and the height of said circuit board is less than 0.03 mm.

7. The light emitting device of claim 1, wherein said circuit board is soldered to said heat dissipating plate using a high melting point solder.

8. The light emitting device of claim 1, further comprising a monitor unit including a thermistor that is used for detecting the temperature of said light emitting element.

* * * * *